(12) United States Patent
Kuroda et al.

(10) Patent No.: US 11,903,141 B2
(45) Date of Patent: Feb. 13, 2024

(54) METHOD FOR MANUFACTURING WIRING BOARD

(71) Applicant: TOYOTA JIDOSHA KABUSHIKI KAISHA, Toyota (JP)

(72) Inventors: Keiji Kuroda, Toyota (JP); Rentaro Mori, Kasugai (JP); Hiroshi Yanagimoto, Miyoshi (JP); Haruki Kondoh, Okazaki (JP); Kazuaki Okamoto, Toyota (JP); Akira Kato, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/400,715

(22) Filed: Aug. 12, 2021

(65) Prior Publication Data
US 2022/0061165 A1 Feb. 24, 2022

(30) Foreign Application Priority Data
Aug. 21, 2020 (JP) .................. 2020-140413

(51) Int. Cl.
*C25D 3/38* (2006.01)
*H05K 3/24* (2006.01)
*C25D 17/00* (2006.01)

(52) U.S. Cl.
CPC .............. *H05K 3/242* (2013.01); *C25D 3/38* (2013.01); *C25D 17/002* (2013.01); *C25D 17/005* (2013.01); *H05K 2203/0723* (2013.01)

(58) Field of Classification Search
None
See application file for complete search history.

(56) References Cited

U.S. PATENT DOCUMENTS

| 5,127,998 A | 7/1992 | Cole, Jr. et al. |
| 5,230,965 A * | 7/1993 | Cole, Jr. ............ H01L 21/4846 |
| | | 205/123 |

(Continued)

FOREIGN PATENT DOCUMENTS

| EP | 3037571 A1 | 6/2016 |
| JP | 03-207886 A | 9/1991 |

(Continued)

OTHER PUBLICATIONS

Official Action (Restriction Requirement) dated Jul. 13, 2022 issued by the U.S. Patent and Trademark Office in U.S. Appl. No. 17/366,417.

(Continued)

*Primary Examiner* — Stefanie S Wittenberg
(74) *Attorney, Agent, or Firm* — Dickinson Wright, PLLC (57) ABSTRACT

A method for manufacturing a wiring board in which the adhesion between an underlayer and a seed layer is improved. A diffusion layer in which an element forming the underlayer and an element forming a coating layer are mutually diffused is formed between the underlayer and a wiring portion of the coating layer by irradiating the wiring portion with a laser beam. A seed layer is formed by removing a portion excluding the wiring portion of the coating layer from the underlayer. A metal layer is formed by disposing a solid electrolyte membrane between an anode and the seed layer and applying voltage between the anode and the underlayer. An exposed portion without the seed layer of the underlayer is removed from an insulating substrate.

4 Claims, 8 Drawing Sheets

(56) References Cited

U.S. PATENT DOCUMENTS

| | | |
|---|---|---|
| 10,854,352 B1 * | 12/2020 | Ram .................. B32B 38/10 |
| 2005/0103761 A1 * | 5/2005 | Miki .................. H01R 13/03 |
| | | 219/121.69 |
| 2008/0311414 A1 | 12/2008 | Tanaka et al. |
| 2010/0263921 A1 | 10/2010 | Nakahara et al. |
| 2013/0065351 A1 * | 3/2013 | Baker-O'Neal ......... C25D 5/12 |
| | | 257/E31.127 |
| 2013/0220535 A1 | 8/2013 | Lee et al. |
| 2014/0023881 A1 | 1/2014 | Sakaguchi et al. |
| 2015/0014178 A1 | 1/2015 | Hiraoka et al. |
| 2016/0076162 A1 | 3/2016 | Sato et al. |
| 2016/0186354 A1 | 6/2016 | Hiraoka et al. |
| 2016/0289840 A1 * | 10/2016 | Sato .................. C25D 5/02 |
| 2017/0347449 A1 * | 11/2017 | Sugiura ................ H05K 3/24 |
| 2018/0014403 A1 | 1/2018 | Kasuga et al. |
| 2019/0029122 A1 | 1/2019 | Len et al. |
| 2019/0256996 A1 * | 8/2019 | Glatthaar ............. H01L 33/62 |
| 2020/0245458 A1 | 7/2020 | Miyata et al. |
| 2020/0404781 A1 * | 12/2020 | Furushou ............... C25D 3/38 |
| 2021/0084774 A1 | 3/2021 | Okamoto et al. |
| 2022/0014286 A1 | 1/2022 | Talarico et al. |

FOREIGN PATENT DOCUMENTS

| | | |
|---|---|---|
| JP | 2002299833 A | 10/2002 |
| JP | 2008308367 A | 12/2008 |
| JP | 2014-185371 A | 10/2014 |
| JP | 2016125087 A | 7/2016 |
| JP | 2021048210 A | 3/2021 |
| KR | 101046255 B1 | 7/2011 |
| KR | 20160079709 A | 7/2016 |
| KR | 20170133158 A | 12/2017 |
| WO | 20130125643 A1 | 8/2013 |

OTHER PUBLICATIONS

Non-Final Office Action dated Sep. 23, 2022 issued by the U.S. Patent and Trademark Office in U.S. Appl. No. 17/366,417.

Notice of Allowance issued in U.S. Appl. No. 17/366,417 dated Feb. 27, 2023.

* cited by examiner

Portion not irradiated with laser beam (Ag not present)
Portion irradiated with laser beam (Ag present)

Portion irradiated with laser beam (Ag present)

Portion not irradiated with laser beam (Ag not present)

METHOD FOR MANUFACTURING WIRING BOARD

CROSS REFERENCE TO RELATED APPLICATIONS

The present application claims priority from Japanese patent application JP 2020-140413 filed on Aug. 21, 2020, the entire content of which is hereby incorporated by reference into this application.

BACKGROUND

Technical Field

The present disclosure relates to a method for manufacturing a wiring board including a substrate and a wiring layer having a predetermined wiring pattern formed on the surface of the substrate.

Background Art

In the conventional methods for manufacturing a wiring board, a metal layer serving as a wiring pattern is formed on the surface of a substrate. Such methods for manufacturing a wiring pattern use a method of film deposition of metallic coating as disclosed in JP 2016-125087 A, for example. The method of film deposition firstly forms a seed layer corresponding to a wiring pattern on the surface of a substrate. Next, the method brings the seed layer into contact with a solid electrolyte membrane impregnated with metal ions, and then applies a power source voltage between an anode and the seed layer as a cathode, thereby to deposit the metal impregnated in the solid electrolyte membrane on the seed layer. Thus, the method can obtain a wiring pattern of a metal layer deposited on the seed layer.

SUMMARY

In the film deposition method disclosed in JP 2016-125087 A, a power source is coupled to a portion of the seed layer so that the seed layer functions as a cathode. However, as the wiring pattern becomes minute, it becomes difficult to couple the power source to all of the wiring portions forming the seed layer.

Thus, the inventors have considered preparing a substrate with seed-layer that includes an electrically conductive underlayer on the surface of an insulating substrate and an electrically conductive seed layer on the surface of the underlayer. However, in the case of the underlayer and the seed layer having a low adhesion therebetween, when the metal impregnated in the solid electrolyte membrane is deposited on the seed layer and the solid electrolyte membrane is then peeled off from the seed layer, the seed layer could be peeled off from the underlayer.

The present disclosure has been made in view of the foregoing, and provides a method for manufacturing a wiring board having an improved adhesion between an underlayer and a seed layer.

In view of the foregoing, the present disclosure provides a method for manufacturing a wiring board including an insulating substrate, and a wiring layer disposed on the surface of the insulating substrate and having a predetermined wiring pattern, the method comprising: preparing a substrate with coating-layer including the insulating substrate, an electrically conductive underlayer disposed on the surface of the insulating substrate, and an electrically conductive coating layer disposed so as to coat the surface of the underlayer; forming a diffusion layer in which an element forming the underlayer and an element forming the coating layer are mutually diffused, between the underlayer and a wiring portion of the coating layer, by irradiating the wiring portion of the coating layer corresponding to the predetermined wiring pattern with a laser beam; forming a seed layer on the underlayer via the diffusion layer by removing a portion excluding the wiring portion of the coating layer, as a removing portion, from the underlayer of the substrate with coating-layer in which the diffusion layer is formed; forming a metal layer on a surface of the seed layer by disposing a solid electrolyte membrane between an anode and the seed layer as a cathode, pressing the solid electrolyte membrane against at least the seed layer, and applying voltage between the anode and the underlayer to reduce metal ions contained in the solid electrolyte membrane; and forming the wiring layer by removing, from the insulating substrate, an exposed portion without the seed layer of the underlayer.

According to a manufacturing method of the present disclosure, the method includes preparing a substrate with coating-layer including an insulating substrate, an electrically conductive underlayer disposed on the surface of the insulating substrate, and an electrically conductive coating layer disposed so as to coat the surface of the underlayer, and irradiating a wiring portion of the coating layer corresponding to a predetermined wiring pattern with a laser beam. This wiring portion is a portion where the seed layer that forms a part of the wiring layer is formed and that has the same shape and size as those of the wiring pattern when the substrate is seen in a plan view. The laser beam irradiation can form a diffusion layer in which the element forming the underlayer and the element forming the coating layer are mutually diffused, between the underlayer and the wiring portion of the coating layer, which can improve the adhesion between the underlayer and the wiring portion of the coating layer.

The seed layer is formed on the underlayer via the diffusion layer by removing the portion excluding the wiring portion of the coating layer, as a removing portion, from the underlayer of the substrate with coating-layer in which the diffusion layer is formed. It should be noted that the seed layer corresponds to a portion excluding the diffusion layer of the wiring portion of the coating layer. The seed layer is bonded to the underlayer via the diffusion layer, which thus improves the adhesion between the underlayer and the seed layer. Therefore, the removing portion where the diffusion layer is not present can be easily removed from the underlayer Further, in the present disclosure, a metal layer is formed on the seed layer formed on the underlayer via the diffusion layer. To this end, the solid electrolyte membrane is pressed against the seed layer and voltage is applied between the anode and the underlayer to reduce metal ions contained in the solid electrolyte membrane so that a metal layer is formed on the surface of the seed layer. Herein, for example, when the surface of the underlayer contains an oxide, even if the solid electrolyte membrane is pressed against the underlayer as well as the seed layer, the metal layer can be selectively formed only on the surface of the seed layer. Therefore, the metal layer can be formed on the surface of the seed layer without using a resin resist pattern.

After the metal layer is formed, the exposed portion without the seed layer of the underlayer is removed, so that the wiring layer having a predetermined wiring pattern can be formed on the surface of the insulating substrate.

As stated above, the method can form the metal layer on the surface of the seed layer without using a resin resist pattern. This eliminates the need for forming and removing a resist pattern. As a result, the method does not require multiple steps in manufacturing the wiring board and can suppress generation of a large amount of liquid waste.

In some embodiments, in a step of forming the diffusion layer, a permeable member permeable to the laser beam is made to adhere to the surface of the coating layer, and with the permeable member kept adhering to the surface of the coating layer, the wiring portion of the coating layer is irradiated with the laser beam via the permeable member, so that the diffusion layer is formed, and in a step of forming the seed layer, the removing portion of the coating layer is removed from the underlayer such that the permeable member is peeled off from the substrate with coating-layer, together with the removing portion of the coating layer.

According to this embodiment, the wiring portion of the coating layer is irradiated with the laser beam via the permeable member permeable to the laser beam, with the permeable member kept adhering to the surface of the coating layer. Since the diffusion layer is not formed between the underlayer and the removing portion of the coating layer, the adhesion between the removing portion of the coating layer and the underlayer is weaker than that between the wiring portion of the coating layer and the underlayer. Thus, the removing portion can be easily peeled off from the underlayer leaving the wiring portion on the underlayer via the diffusion layer.

In some embodiments, the element forming the coating layer is a noble metal element, and the underlayer of the prepared substrate with coating-layer contains an oxide at the interface with the coating layer. In the step of forming the diffusion layer, a diffusion layer in which oxygen originating from the oxide is diffused is formed as the diffusion layer by irradiating the wiring portion of the coating layer with the laser beam.

Since noble metal elements typically have a low affinity with an oxide, when the underlayer contains an oxide at the interface with the coating layer, the adhesion between the wiring portion of the coating layer and the underlayer cannot be expected. However, according to this embodiment, the laser beam irradiation diffuses the oxygen of the oxide present at the interface of the underlayer with the coating layer as well as the other elements, so that the diffusion layer is formed. Thus, the performance of peeling the removing portion from the underlayer can be improved while the adhesion of the wiring portion to the underlayer is secured.

In some embodiments, the coating layer contains metallic nanoparticles. According to this embodiment, gaps are formed between the metallic nanoparticles contained in the coating layer. The gaps allow the laser beam to penetrate through the coating layer and to easily reach the interface between the underlayer and the wiring portion of the coating layer. As a result, the laser beam energy can be fed to the interface between the underlayer and the wiring portion of the coating layer, so that the diffusion layer in which the elements of the underlayer and the coating layer are more uniformly diffused can be stably formed at the interface between the underlayer and the wiring portion of the coating layer.

According to a method for manufacturing a wiring board of the present disclosure, the adhesion between the underlayer and the seed layer can be improved.

DETAILED DESCRIPTION

A method for manufacturing a wiring board of an embodiment according to the present disclosure will be described below.

Figure 1:
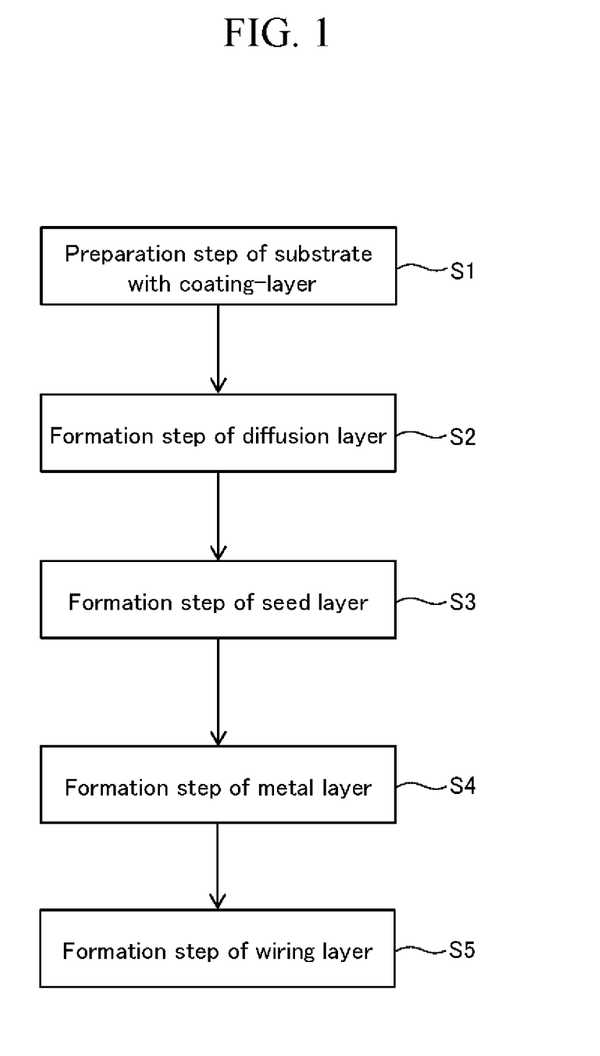
FIG. 1 is a flowchart of a method for manufacturing a wiring board according to the present disclosure.

A method for manufacturing a wiring board 1 according to the present embodiment will be described. FIG. 1 is a flowchart of a method for manufacturing the wiring board 1 according to the embodiment of the present disclosure. FIG. 2A to FIG. 2E are schematic conceptual views for explaining, respectively, a preparation step S1 of a substrate with coating-layer 10A, a formation step S2 of a diffusion layer 14, a formation step S3 of a seed layer 13, a formation step S4 of a metal layer 15, and a formation step S5 of a wiring layer 2.

Figure 2A:
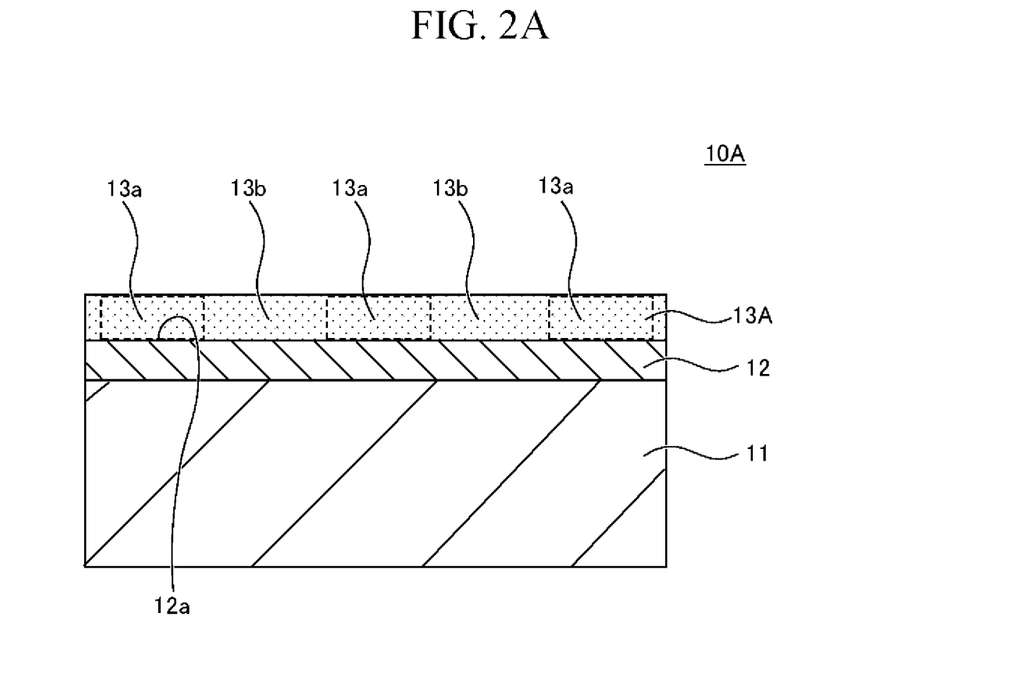
FIG. 2A is a schematic conceptual view for explaining a step of preparing a substrate with coating-layer of FIG. 1.
Figure 2B:
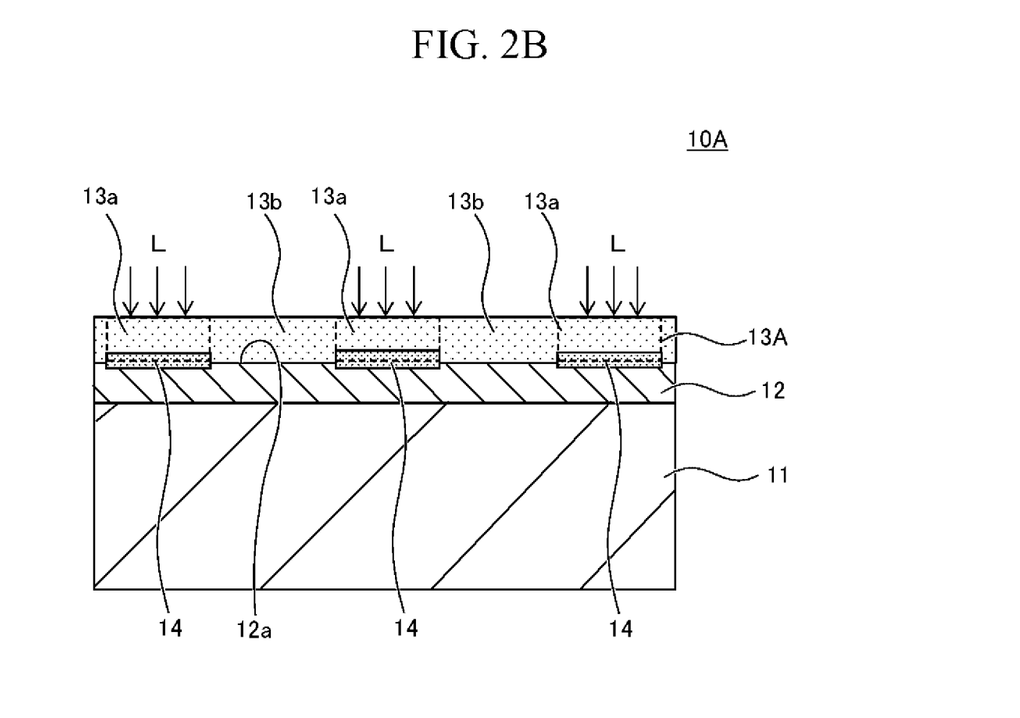
FIG. 2B is a schematic conceptual view for explaining a step of forming a diffusion layer of FIG. 1.
Figure 2C:
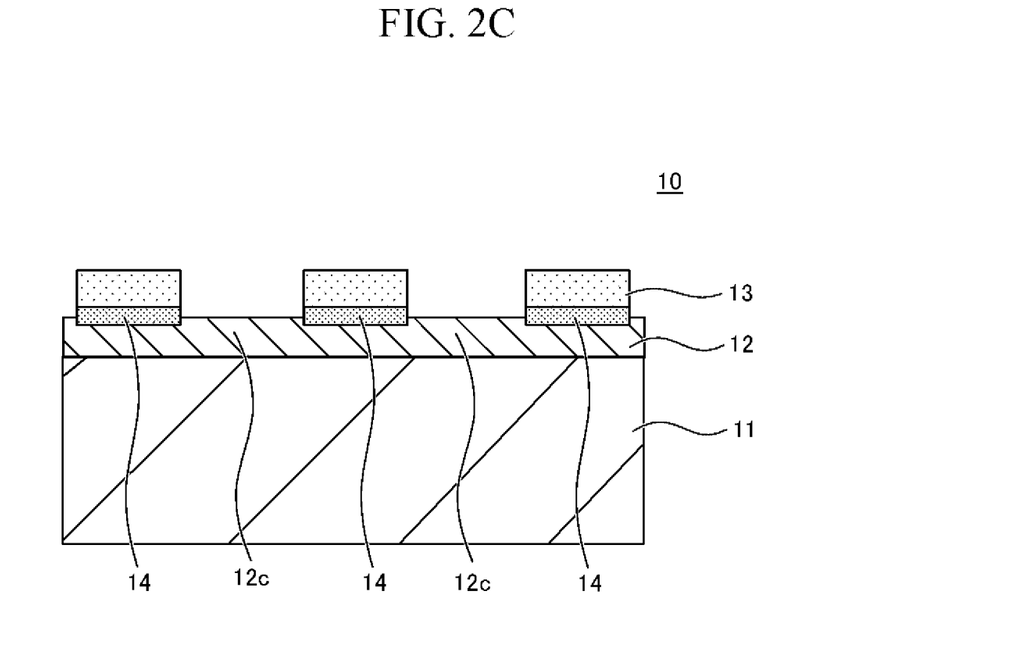
FIG. 2C is a schematic conceptual view for explaining a step of forming a seed layer of FIG. 1.
Figure 2D:
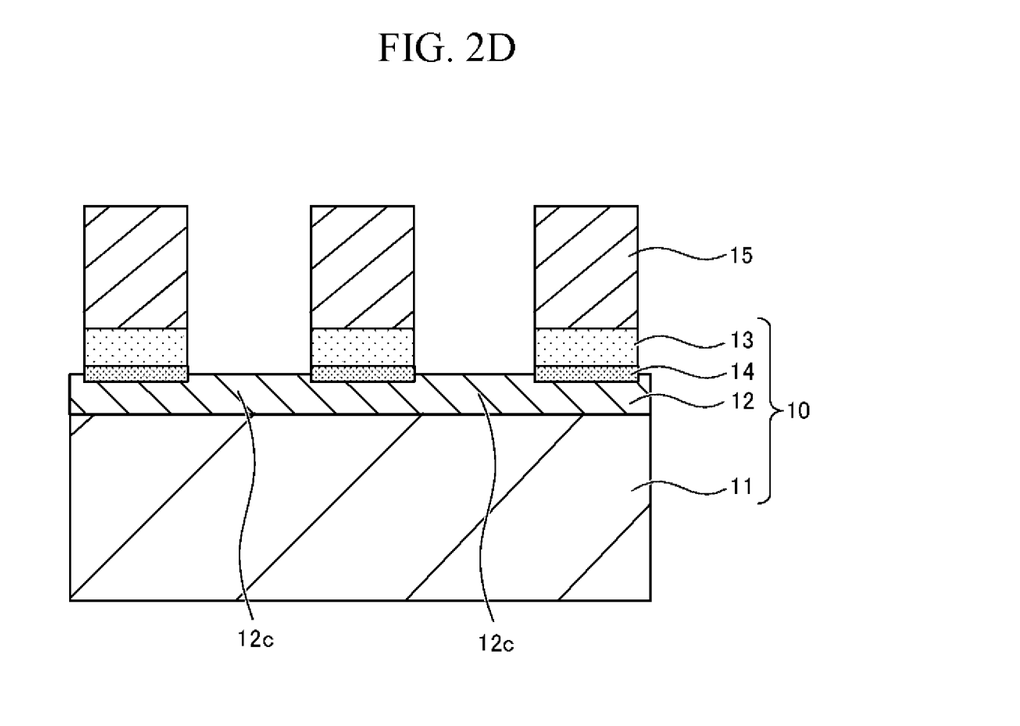
FIG. 2D is a schematic conceptual view for explaining a step of forming a metal layer of FIG. 1.
Figure 2E:
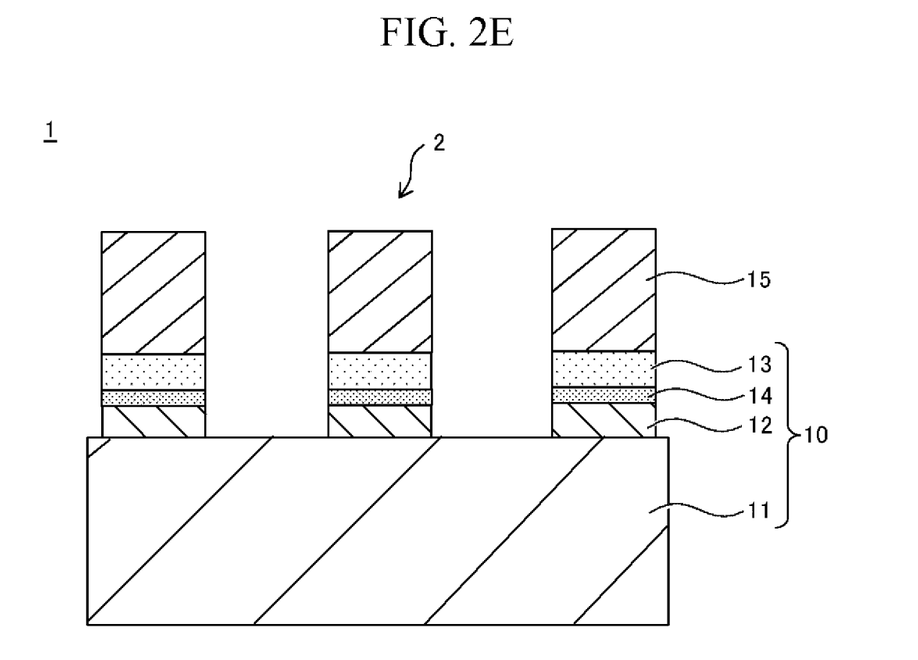
FIG. 2E is a schematic conceptual view for explaining a step of forming a wiring layer of FIG. 1.

The method for manufacturing the wiring board 1 according to the present embodiment can be applied to the manufacturing of the wiring board 1 including an insulating substrate 11 and the wiring layer 2 disposed on the surface of the insulating substrate 11 and having a predetermined wiring pattern (see FIG. 2E). In particular, the manufacturing method is suitable for manufacturing of a wiring board having a high-density wiring pattern.

1. Preparation Step S1 of Substrate with Coating-Layer

The manufacturing method of the present embodiment firstly performs the preparation step S1 of the substrate with coating-layer, as shown in FIG. 1. In this step, as shown in FIG. 2A, the substrate with coating-layer 10A is prepared that includes the substrate 11, the underlayer 12 disposed on the surface of the substrate 11, and a coating layer 13A disposed so as to coat the surface of the underlayer 12. It should be noted that the specification refers to the substrate (see FIG. 2C) in which the diffusion layer 14 and the seed layer 13 are formed, as a substrate with seed-layer 10.

(1) Substrate 11

The substrate 11 is not particularly limited as long as it has an insulating property, and in some embodiments, a substrate made of a glass epoxy resin, a substrate made of a baked glass epoxy resin, a flexible film-like substrate made of a polyimide resin, for example, or a substrate made of glass is used. In the present embodiment, particularly, a substrate made of a glass epoxy resin may be used for the substrate 11.

When the substrate 11 is made of resin, examples of the resin include thermoplastic resin, such as ABS resin, AS resin, AAS resin, PS resin, EVA resin, PMMA resin, PBT resin, PET resin, PPS resin, PA resin, POM resin, PC resin, PP resin, PE resin, PI resin (polyimide), polymer alloy resin containing elastomer and PP, modified PPO resin, PTFE resin, ETFE resin, or the like, thermosetting resin, such as phenol resin, melamine resin, amino resin, unsaturated polyester resin, polyurethane, diallylphthalate, silicone resin, alkyd resin, or the like, resin obtained by adding cyanate resin to epoxy resin, for example, and liquid crystal polymer.

(2) Underlayer 12

The underlayer 12 is electrically conductive and supplies current to the seed layer 13 in forming the metal layer 15 that will be described later. The underlayer 12 may contain an oxide at an interface 12a with the coating layer 13A. The oxide may be an oxide originating from metal forming the underlayer 12 or an oxide attached to the body of the underlayer 12. With such an oxide, in the formation step S4 of the metal layer 15, which will be described later, even when a solid electrolyte membrane 52 contacts an exposed surface of the underlayer 12, the metal originating from the metal layer 15 can be prevented from being deposited on the exposed surface of the underlayer 12 and selectively deposited on the seed layer 13.

The oxide may be a natural oxide film formed naturally due to natural oxidation in the atmosphere or may be an oxide film (oxide layer) formed by surface treatment (for example, oxidation).

Examples of the natural oxide film may include a silicon oxide film when the underlayer 12 is silicide such as $ZrSi_2$ and $WSi_2$, which will be described later, and a passive film made of metal of Al, Cr, and Ti and their alloy when the underlayer 12 is made of such metals.

Meanwhile, examples of the oxide film formed by surface treatment may include an oxide film having a higher insulating property than that of the underlayer 12, specifically, an oxide film formed by performing oxidation treatment on the surface of the underlayer 12 or an oxide film separately disposed on the surface of the underlayer 12 by vapor deposition. Examples of the oxidation treatment may include $O_2$ plasma treatment, laser beam irradiation under an oxygen atmosphere, or furnace heating under an oxygen atmosphere. Examples of the vapor deposition may include plasma CVD (chemical vapor deposition), thermal CVD, or PVD (physical vapor deposition) using sputtering. It should be noted that the surface treatment to form an oxide film may be performed prior to forming the coating layer 13A on the surface of the underlayer 12.

Examples of the material of the underlayer 12 may include specifically metal silicide such as $ZrSi_2$, $WSi_2$, $CrSi_2$, or $MoSi_2$, metal such as Al, Ti, Zr, Cr, Ni, or Si, or one or more of these metals.

The layer thickness of the underlayer 12 is not particularly limited, and may be 1 to 200 nm in some embodiments. When the layer thickness of the underlayer 12 is less than 1 nm, it is difficult to form the underlayer 12, while when the layer thickness of the underlayer 12 exceeds 200 nm, the material and process costs could increase.

The underlayer 12 is formed on the entire surface on one side of the substrate 11. The method for forming the underlayer 12 is not particularly limited, and the examples of the method may include PVD such as sputtering, CVD using plasma or the like, electro or electroless plating, spin coating, or printing.

(3) Coating Layer 13A

The coating layer 13A is an electrically conductive layer. The coating layer 13A has sections of a wiring portion 13a having a size and a shape that correspond to a predetermined wiring pattern of the wiring layer 2, and the other portion which is a removing portion 13b, when the substrate 11 is seen in a plan view. The wiring portion 13a is a portion enclosed by a dashed imaginary line in FIG. 2A and forms a part of the wiring layer 2 described later, while the removing portion 13b is to be removed from the substrate with coating-layer 10A.

In the present embodiment, the layer thickness of the coating layer 13A is not particularly limited, and may be in the range of 100 to 500 nm for securing the patterning accuracy by a laser beam L that will be described later.

Examples of elements forming the coating layer 13A may be noble metal elements that are highly resistant to oxidation. Examples of such noble metal elements to be used may include one or more types of metals selected from the group consisting of Pt, Pd, Rh, Cu, Ag, and Au.

The coating layer 13A is formed so as to coat the surface of the underlayer 12. The method for forming the coating layer 13A is not particularly limited as long as it can be formed so as to coat the surface of the underlayer 12. Examples of the method may include PVD such as sputtering, CVD using plasma or the like, electro or electroless plating, spin coating, or printing.

Herein, the coating layer 13A formed by sputtering is a film continuously and densely formed. Thus, in forming the diffusion layer 14 shown in FIG. 2B, the laser beam L with which the wiring portion 13a is irradiated does not easily penetrate through the coating layer 13A. This occasionally makes it difficult for the laser beam L to reach the interface 12a of the underlayer 12 and to form the diffusion layer 14 described later. Thus, considering the penetration of the laser beam L for easy formation of the diffusion layer 14, the coating layer 13A may be formed using ink (hereinafter referred to as "ink") in which metallic nanoparticles are dispersed in a dispersion medium.

The coating layer 13A formed as such contains metallic nanoparticles, between which gaps are formed. Such gaps facilitate the reaching of the laser beam L to the interface 12a of the underlayer 12 in irradiating the laser beam L. This consequently enables the energy of the laser beam L to be fed to the interface between the underlayer 12 and the wiring portion 13a of the coating layer 13A, thereby being capable of stably forming, between the underlayer 12 and the wiring portion 13a of the coating layer 13A, the diffusion layer 14 in which the elements of these layers are more uniformly diffused.

In the present specification, "nanoparticles" refer to particles having an average particle diameter of several to one hundred nano orders. Examples of the method for measuring the nanoparticle diameter may include a method in which particles within a given range in an FE-SEM image or a TEM image of metallic nanoparticles are extracted from the image to obtain the average value of the diameter (approximated diameter as a circle) of those metallic nanoparticles, so that the obtained value is determined to be the average particle diameter.

The average particle diameter of the metallic nanoparticles is not particularly limited, and may be smaller in some embodiments to form the wiring in the μm order. In one example, the average particle diameter may be 1 nm or more and 50 nm or less in the nm order. In one example, use of metallic nanoparticles having an average particle diameter of 20 nm or less may lower the melting point of the metallic particles, thereby facilitating the sintering. Examples of the metallic nanoparticles may include noble metal elements similar to those forming the coating layer 13A cited as examples.

When the coating layer 13A is formed using ink, ink is applied onto the surface of the underlayer 12 so as to coat the surface of the underlayer 12 and the applied ink is dried (sintered). The method for applying ink is not particularly limited, and spin coating, spraying, gravure printing, or the like may be used. The ink may be dried at a temperature equal to or lower than the heat-resistant temperature of the substrate 11 (for example, about 250° C. or lower when the substrate 11 made of a glass epoxy resin is used).

The ink contains metallic nanoparticles and a dispersion medium in which the metallic nanoparticles are dispersed, and may further contain an additive, as necessary. The dispersion medium is not particularly limited and has a property of volatilizing during drying in some embodiments. In one example, decanol can be used as the dispersion medium, and a linear fatty acid salt having around 10 to 17 carbon atoms can be used as the additive.

When the ink is used to form the coating layer 13A, the ink to become the coating layer 13A is dried until the amount of the dispersion medium remaining in the coating layer 13A (hereinafter referred to as the "remaining amount of the dispersion medium") is reduced to 1.0 mass % or less, or particularly, 0.1 mass % or less relative to the coating layer 13A in some embodiments. This can improve the adhesion between the underlayer 12 and the wiring portion 13a of the coating layer 13A.

Herein, when the remaining amount of the dispersion medium exceeds 1.0 mass %, the irradiation of the laser beam L causes the dispersion medium to evaporate to thereby rapidly expand in volume, so that the metallic nanoparticles could scatter. This makes it difficult to form the diffusion layer 14 in which the metal forming the coating layer 13A is diffused, which could result in a lower adhesion between the underlayer 12 and the wiring portion 13a of the coating layer 13A.

It should be noted that the remaining amount of the dispersion medium is the proportion (%) of the mass of the dispersion medium remaining in the coating layer 13A relative to the coating layer 13A (the total mass of the metallic nanoparticles forming the coating layer 13A and the dispersion medium remaining in the coating layer 13A). Herein, the amount of the metallic nanoparticles forming the coating layer 13A and the amount of the dispersion medium remaining in the coating layer 13A can be measured by the GC-MS (gas chromatography) or the like.

2. Formation Step S2 of Diffusion Layer 14

Next, the formation step S2 of the diffusion layer 14 is performed, as shown in FIG. 1. In this step, as shown in FIG. 2B, the wiring portion 13a of the coating layer 13A corresponding to the wiring pattern of the wiring layer 2 is irradiated with the laser beam L so as to form, between the underlayer 12 and the wiring portion 13a of the coating layer 13A, the diffusion layer 14 in which the elements forming the underlayer 12 and the coating layer 13A are mutually diffused.

Herein, the underlayer 12 and the wiring portion 13a of the coating layer 13A bond together due to the diffusion of the elements that occurs on the contacting surface between the underlayer 12 (solid phase) and the wiring portion 13a (solid phase) through the irradiation of the laser beam L, but not by melting of the underlayer 12 and the wiring portion 13a.

The diffusion layer 14 in which the elements are diffused as such has a relatively large quantity of elements forming the coating layer 13A on its coating layer side, and a relatively large quantity of elements forming the underlayer 12 on its underlayer side. As a result, the adhesion between the underlayer 12 and the wiring portion 13a of the coating layer 13A can be improved via the diffusion layer 14.

Further, the diffusion layer 14 can be formed with instant heat generated by the irradiation of the laser beam L. Thus, even when a substrate such as those made of a glass epoxy resin or a resin having a low heat-resistant temperature is used for the substrate 11, the diffusion layer 14 can be formed without damaging the substrate 11.

Typically, the coating layer 13A made of metal does not easily adhere to the oxide. Thus, when the underlayer 12 contains an oxide at the interface 12a (see FIG. 2A) with the coating layer 13A, the oxide at the interface 12a is likely to lower the adhesion between the underlayer 12 and the coating layer 13A. Noble metal elements, in particular, have a low affinity with the oxygen element of an oxide. Therefore, when a noble metal element forms the coating layer 13A, typical heat treatment cannot easily bond the noble metal element of the coating layer 13A to the oxide.

In the present embodiment, the irradiation of the laser beam L can instantly increase the temperatures of the wiring portion 13a of the coating layer 13A and the interface 12a of the underlayer 12 adjacent to the wiring portion 13a, which facilitates the diffusion of the noble metal element forming the coating layer 13A also into the oxide, thereby enabling the formation of the diffusion layer 14 in which the oxygen element originating from the oxide as one of the elements forming the underlayer 12 and the noble metal element are diffused. As a result, the adhesion between the underlayer 12 and the wiring portion 13a of the coating layer 13A can be improved via the diffusion layer 14.

In the present embodiment, the conditions of irradiating the laser beam L are not particularly limited as long as the diffusion layer 14 can be formed, and may be adjusted as appropriate, considering the conditions such as the wiring width (the width of the wiring portion 13a), the film thickness of the coating layer 13A, or the rate of absorption of the laser beam L by the ink. Further, in some embodiments, the conditions of irradiating the laser beam L may be set within the extent that the metal forming the coating layer 13A does not partially melt or agglomerate on the surface of the coating layer 13A.

The laser beam L is not particularly limited as long as the diffusion layer 14 can be formed, and is a laser beam generated by lasers such as a solid laser, e.g., a YAG laser, a gas laser using $CO_2$ or the like, or a semiconductor laser. The method for generation and irradiation of the laser beam is not particularly limited. In some embodiments, the laser beam L may be within the wavelength region of the infrared ray, and may be within the wavelength region (780 to 2,500 nm) of the near infrared ray. The irradiation of the laser beam L within the wavelength region of the near infrared ray increases the temperatures of the underlayer 12 and the coating layer 13A in a short period of time, thereby enabling the diffusion layer 14 with a high mutual diffusion to be formed.

Figure 7:
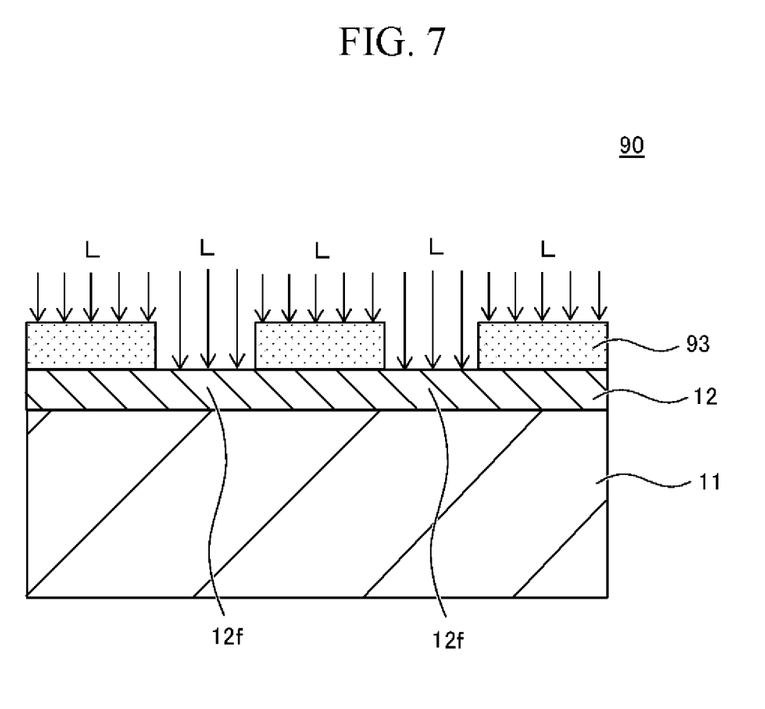
FIG. 7 is a view for explaining formation of the diffusion layer by irradiating a seed layer having a predetermined pattern with a laser beam.

Unlike the present embodiment, it is also conceived that the diffusion layer may be formed by irradiating a seed layer 93 having a predetermined pattern with the laser beam L, as in the comparative example shown in FIG. 7. However, it is difficult to irradiate only the seed layer 93 with the laser beam L. When an exposed portion 12f without the seed layer 93 of the underlayer 12 is irradiated with the laser beam L, the following problems could occasionally occur. Specifically, since the exposed portion 12f has a higher absorption rate of the laser beam L than a portion coated with the seed layer 93, the substrate 11 could be damaged. In particular, in a case where the surface of the exposed portion 12f is oxidized or contains oxygen in a slight amount and the irradiation of the laser beam L is performed, the absorption rate of the laser beam L in the exposed portion 12f is further increased, thereby encouraging the damage to the substrate 11 in some cases.

Meanwhile, in the present embodiment, in irradiating the laser beam L, since the underlayer 12 is coated with the coating layer 13A, the coating layer 13A functions as a protective layer of the underlayer 12 against the laser beam L. Thus, the underlayer 12 is not directly irradiated with the laser beam L, which can suppress the heat generation in the underlayer 12 caused by the direct irradiation of the laser beam L and generation of an oxide in the underlayer 12, thereby preventing the damage to the substrate 11.

3. Formation Step S3 of Seed Layer 13

Next, as shown in FIG. 1, the formation step S3 of the seed layer 13 is performed. In this step, the portion excluding the wiring portion 13a of the coating layer 13A is removed, as the removing portion 13b, from the underlayer 12 (see FIG. 2C) of the substrate with coating-layer 10A (see FIG. 2B) in which the diffusion layer 14 is formed, so that the seed layer 13 is formed on the underlayer 12 via the diffusion layer 14. The seed layer 13 is a layer formed of the wiring portion 13a.

The method for removing the removing portion 13b is not particularly limited as long as the removing portion 13b can be removed. For example, though not shown in the drawings, an adhesive tape may be applied onto the surface of the coating layer 13A and the removing portion 13b may be removed from the substrate with coating-layer 10A, together with the adhesive tape.

Herein, as described above, since the diffusion layer 14 is formed between the underlayer 12 and the wiring portion 13a of the coating layer 13A, the adhesion between the wiring portion 13a of the coating layer 13A and the underlayer 12 can be secured. Meanwhile, since the diffusion layer 14 is not formed between the underlayer 12 and the removing portion 13b of the coating layer 13A, the adhesion between the removing portion 13b of the coating layer 13A and the underlayer 12 is weaker than that between the wiring portion 13a of the coating layer 13A and the underlayer 12. Thus, in peeling off the adhesive tape from the surface of the coating layer 13A, the removing portion 13b of the coating layer 13A is easily peeled off. As a result, the removing portion 13b can be easily removed from the underlayer 12 without damaging the substrate 11.

The cohesion between the adhesive tape and the coating layer 13A may be smaller than the adhesion between the wiring portion 13a of the coating layer 13A and the underlayer 12 and greater than the adhesion between the removing portion 13b of the coating layer 13A and the underlayer 12.

Examples of the adhesive tape may include a scotch tape, plastic tape, fabric tape, adhesive paper tape, and Japanese paper tape.

In this manner, the substrate (substrate with seed-layer) 10 in which the seed layer 13 is formed, which is shown in FIG. 2C, can be produced. The seed layer 13 is a layer that functions as a cathode in forming the metal layer 15 having a wiring pattern. In the present embodiment, the seed layer 13 includes a plurality of independent patterns corresponding to the wiring pattern. These independent patterns are spaced apart from each other and are not electrically connected with each other.

The independent patterns forming the seed layer 13 are thus electrically connected with each other via the underlayer 12 and the diffusion layer 14. Therefore, the metal layer 15 can be formed on the seed layer 13 without forming a lead for voltage application on the seed layer 13 in forming the metal layer 15 that will be described later. This eliminates the need for a space for a lead, thereby facilitating the formation of the wiring pattern with a higher density.

Further, in the substrate with seed-layer 10 of the present embodiment, the seed layer 13 is bonded to the underlayer 12 via the diffusion layer 14 formed through the irradiation of the laser beam L, so that the adhesion between the underlayer 12 and the seed layer 13 can be improved.

In addition, as described above, in the substrate with coating-layer 10A, when the underlayer 12 contains an oxide at the interface 12a with the coating layer 13A, the oxide is present on the surface of an exposed portion 12c of the underlayer 12 that is exposed as a result of the removal of the removing portion 13b of the coating layer 13A. This enables the metal layer 15 to be selectively formed on the surface of the seed layer 13 in forming the metal layer 15 as will be described later.

It should be noted that the oxide contained on the surface of the exposed portion 12c of the underlayer 12 may include a natural oxide film naturally formed after removing the removing portion 13b from the underlayer 12. Further, an oxide film may be formed by performing the aforementioned surface treatment on the surface of the exposed portion 12c of the underlayer 12, as necessary.

4. Formation Step S4 of Metal Layer

Figure 3:
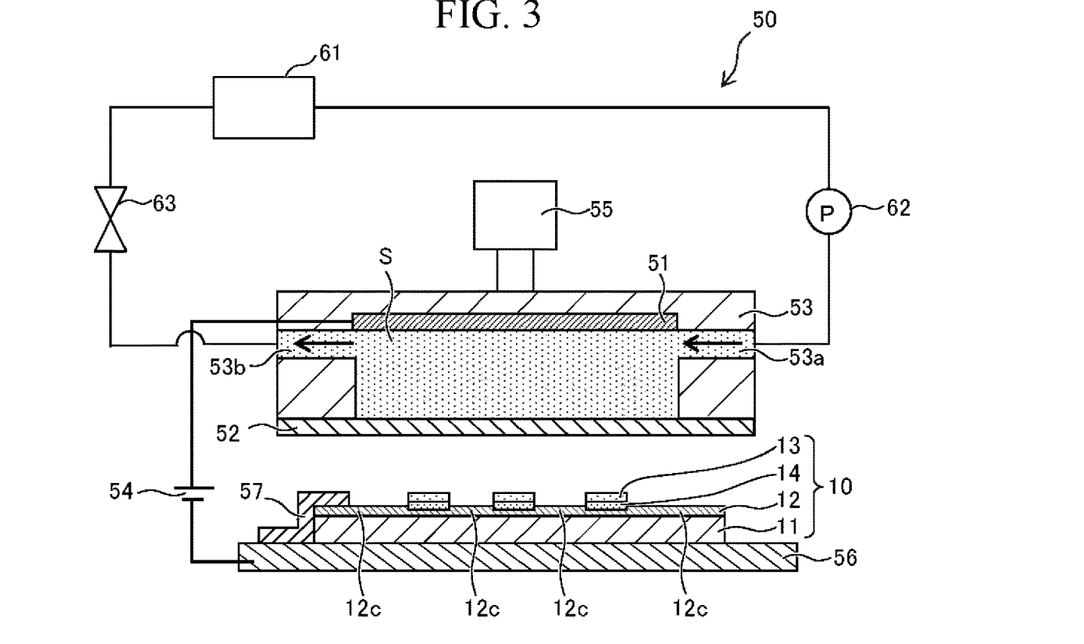
FIG. 3 is a cross-sectional view showing the structure of a film-deposition apparatus that is used to manufacture a wiring board according to an embodiment of the present disclosure.
Figure 4:
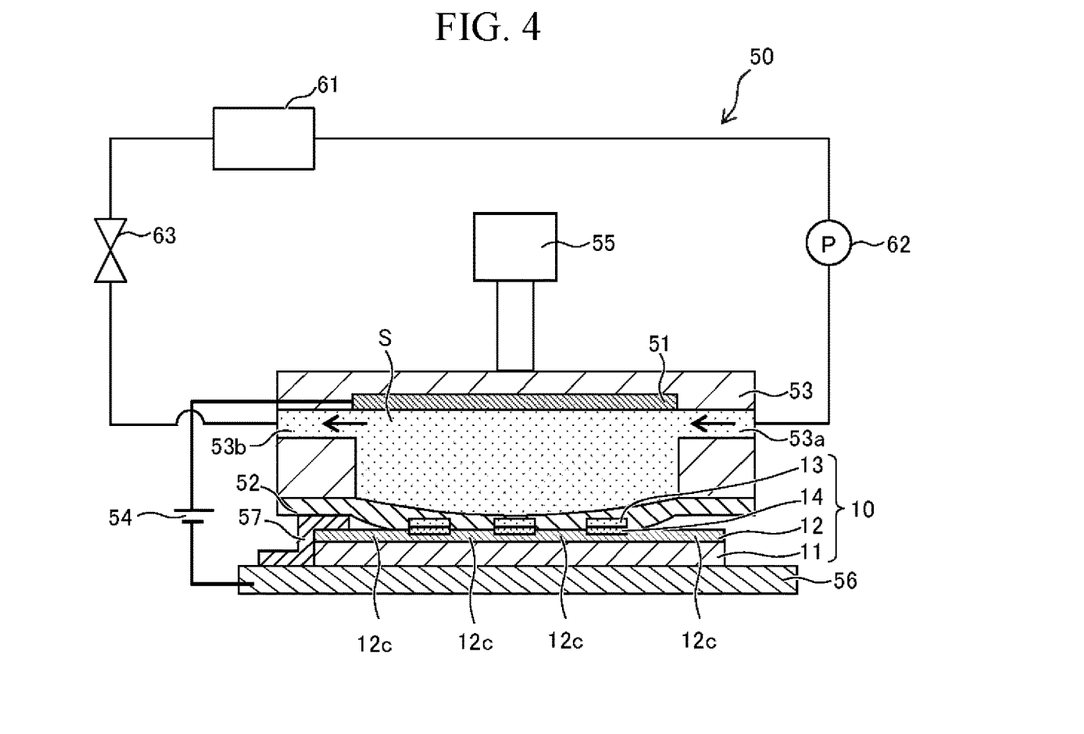
FIG. 4 is a cross-sectional view of the film-deposition apparatus shown in FIG. 3, showing the state of a substrate with seed-layer brought into contact with a solid electrolyte membrane.

Next, as shown in FIG. 1, the formation step S4 of the metal layer 15 is performed. In this step, a film-deposition apparatus 50 shown in FIG. 3 and FIG. 4 is used to form the metal layer 15 on the surface of the seed layer 13 of the substrate with seed-layer 10 as shown in FIG. 2D. The material of the metal layer 15 may be Cu, Ni, Ag, or Au, particularly Cu. The layer thickness of the metal layer 15 is, for example, 1 µm or more and 100 µm or less.

With reference to FIG. 3 and FIG. 4, the film-deposition apparatus 50 will be firstly described and then, the formation of the metal layer 15 using the film-deposition apparatus 50 will be described. FIG. 3 is a cross-sectional view showing the structure of the film-deposition apparatus 50 that is used to manufacture the wiring board 1 according to the embodiment of the present disclosure. FIG. 4 is a cross-sectional view of the film-deposition apparatus 50 shown in FIG. 3 showing the state of the substrate with seed-layer 10 brought into contact with the solid electrolyte membrane 52.

(1) Structure of Film-Deposition Apparatus 50

The film-deposition apparatus 50 is a film-deposition apparatus (i.e., a plating apparatus) for depositing the metal layer 15 as metallic coating by solid electrolyte deposition and is used to deposit (to form) the metal layer 15 on the surface of the seed layer 13.

As shown in FIG. 3, the film-deposition apparatus 50 includes a metal anode 51, a solid electrolyte membrane 52 disposed between the anode 51 and the seed layer 13 as a cathode, and a power supply 54 to apply voltage between the anode 51 and the underlayer 12. The underlayer 12, the diffusion layer 14, and the seed layer 13 are electrically connected with each other, and therefore, electric current flows between the anode 51 and the seed layer 13 during the film deposition by applying voltage between the anode 51 and the underlayer 12 from the power supply 54.

In the present embodiment, the film-deposition apparatus 50 further includes the housing 53. The housing 53 stores the anode 51 and a solution S (hereinafter referred to as a metallic solution S) containing ions of metal (for example, Cu) as the material of the metal layer 15. More specifically, a space for storing the metallic solution S is defined between the anode 51 and the solid electrolyte membrane 52, where the stored metallic solution S flows from one side to the other side.

When the anode 51 and the solid electrolyte membrane 52 are spaced apart from each other as shown in FIG. 3, the anode 51 has a plate-like shape and may be either a soluble anode made of the same material (e.g., Cu) as that of the metal layer 15 or an anode made of material (e.g., Ti) that is insoluble in the metallic solution S. Meanwhile, though not shown in the drawing, when the anode 51 and the solid electrolyte membrane 52 are in contact with each other, the anode 51 may be a porous anode through which the metallic solution S penetrates and that supplies metal ions to the solid electrolyte membrane 52.

It should be noted that pressing the anode 51 against the solid electrolyte membrane 52 could cause uneven deposition due to the uneven pressing force of the anode 51 exerted on the solid electrolyte membrane 52. Thus, for producing a fine wiring pattern, the anode 51 and the solid electrolyte membrane 52 are favorably configured so as to be spaced apart from each other, as shown in FIG. 3.

The solid electrolyte membrane 52 is not particularly limited, as long as the solid electrolyte membrane 52 can be impregnated with (contain) metal ions when brought into contact with the aforementioned metallic solution S and the metal originating from the metal ions can be deposited on the surface of the cathode (seed layer 13) when voltage is applied.

The thickness of the solid electrolyte membrane 52 is about 5 μm to about 200 μm, for example. Examples of the material of the solid electrolyte membrane 52 include resin having a cation exchange function, including fluorine-based resin, such as Nafion (registered trademark) manufactured by DuPont, hydrocarbon resin, polyamic acid resin, and Selemion (CMV, CMD, CMF series) manufactured by Asahi Glass Co.

The metallic solution S is liquid containing the metal of the metal layer 15 in an ionic state, and examples of the metal may include Cu, Ni, Ag, or Au. The metallic solution S is a solution (ionized) of these metals with an acid, such as nitric acid, phosphoric acid, succinic acid, sulfuric acid, or pyrophosphoric acid.

The film-deposition apparatus 50 of the present embodiment further includes an elevator 55 above the housing 53 to move the housing 53 up and down. The elevator 55 may include a hydraulic or pneumatic cylinder, an electric actuator, a linear guide, and a motor, as long as the elevator 55 can move the housing 53 up and down.

The housing 53 has a supply port 53a through which the metallic solution S is supplied and a discharge port 53b through which the metallic solution S is discharged. The supply port 53a and the discharge port 53b are connected to a tank 61 via a pipe. The metallic solution S delivered from the tank 61 by a pump 62 flows into the housing 53 through the supply port 53a and is discharged through the discharge port 53b to return to the tank 61. A pressure regulation valve 63 is provided downstream of the discharge port 53b. The pressure regulation valve 63 and the pump 62 can pressurize the metallic solution S in the housing 53 with a predetermined pressure.

With such a configuration, the liquid pressure of the metallic solution S causes the solid electrolyte membrane 52 to press at least the seed layer 13 during the film deposition (see FIG. 4), so that the metal layer 15 can be deposited on the seed layer 13 while uniformly pressing the seed layer 13 with the solid electrolyte membrane 52.

The film-deposition apparatus 50 of this embodiment includes a metallic mount 56 to mount the substrate with seed-layer 10 in which the diffusion layer 14 is formed. The metallic mount 56 is electrically connected (is conductive) to the negative electrode of the power supply 54. The positive electrode of the power supply 54 is electrically connected (is conductive) to the anode 51 that is built in the housing 53.

Specifically, the film-deposition apparatus 50 includes a conductive member 57 that contacts a part of the underlayer 12 or the seed layer 13 (specifically, an end thereof) so as to electrically connect the negative electrode of the power supply 54 with the underlayer 12 or the seed layer 13. The conductive member 57 is a metal plate that covers a part of the edge of the substrate with seed-layer 10, and is partially bent so as to contact the metallic mount 56. This electrically connects the metallic mount 56 with the underlayer 12 via the conductive member 57. The conductive member 57 may be detachable from the substrate with seed-layer 10.

(2) Formation of Metal Layer 15 Using Film-Deposition Apparatus 50

The formation step S4 of the metal layer 15 places the substrate with seed-layer 10 and the conductive member 57 at predetermined positions on the metallic mount 56 as shown in FIG. 3. Then, as shown in FIG. 4, the elevator 55 lowers the housing 53 to a predetermined height.

Next, when the metallic solution S is pressurized by the pump 62, the solid electrolyte membrane 52 follows the shapes of the seed layer 13 and the underlayer 12, and the pressure regulation valve 63 adjusts the pressure of the metallic solution S in the housing 53 to a set constant pressure. That is, the solid electrolyte membrane 52 is able to uniformly press the surface of the seed layer 13 and the surface of the exposed portion 12c of the underlayer 12 with the adjusted liquid pressure of the metallic solution S in the housing 53.

In such a pressed state, voltage is applied between the anode 51 and the underlayer 12 to reduce the metal ions contained in the solid electrolyte membrane 52, so that metal originating from the metal ions is deposited on the surface of the seed layer 13. Since the application of voltage continuously reduces, at the cathode, the metal ions of the metallic solution S in the housing 53, the metal layer 15 is formed on the surface of the seed layer 13 as shown in FIG. 2D.

Herein, when the underlayer 12 contains, on the surface of the exposed portion 12c, an oxide such as a natural oxide film or an oxide film formed by surface treatment, as described above, the surface of the exposed portion 12c has a higher insulating property. Therefore, when the solid electrolyte membrane 52 is in close contact with the surface of the seed layer 13 and the surface of the exposed portion 12c of the underlayer 12, the current flows only on the surface of the seed layer 13. This reduces the metal ions (for example, copper ions) contained in the solid electrolyte membrane 52 so as to deposit the metal (for example, copper) on the surface of the seed layer 13. As a result, the metal layer 15 is formed selectively on the surface of the seed layer 13 (see FIG. 2D) while preventing the metal deposition on the surface of the exposed portion 12c of the underlayer 12. Therefore. the metal layer 15 can be formed on the surface of the seed layer 13 without using a resin resist pattern. It should be noted that when the solid electrolyte membrane 52 contacts only the seed layer 13, the metal is not deposited on the surface of the exposed portion 12c, and in this case also, the metal layer 15 is formed only on the surface of the seed layer 13.

When the metal layer 15 is formed in a predetermined thickness, the application of voltage between the anode 51 and the underlayer 12 is halted to stop the pressurization of the metallic solution S by the pump 62. Then, the housing 53 is raised to a predetermined height so as to peel off the solid electrolyte membrane 52 from the seed layer 13 having the metal layer 15 formed on its surface and the exposed portion 12c of the underlayer 12 (see FIG. 3).

Herein, in the present embodiment, as described above, in the substrate with seed-layer 10, the seed layer 13 bonds to the underlayer 12 via the diffusion layer 14. As a result, the adhesion between the underlayer 12 and the seed layer 13 is improved, which can thus prevent the underlayer 12 and the seed layer 13 from being peeled off from each other when the solid electrolyte membrane 52 is peeled off. After the housing 53 is raised, the substrate with seed-layer 10 (see FIG. 2D) on which the metal layer 15 is formed is removed from the metallic mount 56.

5. Formation Step S5 of Wiring Layer 2

Next, a formation step S5 of the wiring layer 2 is performed as shown in FIG. 1. This step removes, from the substrate 11, the exposed portion 12c without the seed layer 13 of the underlayer 12 (see FIG. 2D), so that the wiring layer 2 is formed on the surface of the substrate 11 (see FIG. 2E).

The method for removing the underlayer 12 is not particularly limited, and various methods, such as plasma etching, sputtering, and chemical etching, may be used. When the underlayer 12 is made of $WSi_2$ or $ZrSi_2$, for example, the exposed portions 12c of the underlayer 12 are removed by plasma etching using $CF_4$ gas in some embodiments. Such removal forms the wiring layer 2 including the portion excluding the exposed portion 12c of the underlayer 12, the diffusion layer 14, the seed layer 13, and the metal layer 15 formed in this order on the surface of the substrate 11 as shown in FIG. 2E.

In the aforementioned manner, the wiring board 1 shown in FIG. 2E can be manufactured. According to the present embodiment, the metal layer 15 is formed on the surface of the seed layer 13 without using a resin resist pattern, as described above, which eliminates the need for forming and removing the resist pattern. As a result, multiple steps are not required in manufacturing the wiring board 1 and generation of a large amount of liquid waste can be suppressed.

In the wiring layer 2 of the manufactured wiring board 1, the seed layer 13 and the portion of the underlayer 12 forming the wiring layer 2 bond together via the diffusion layer 14. Thus, the adhesion between the underlayer 12 and the seed layer 13 is improved, so that the reliability of the wiring board 1 can be improved.

6. Modifications

Figure 5A:
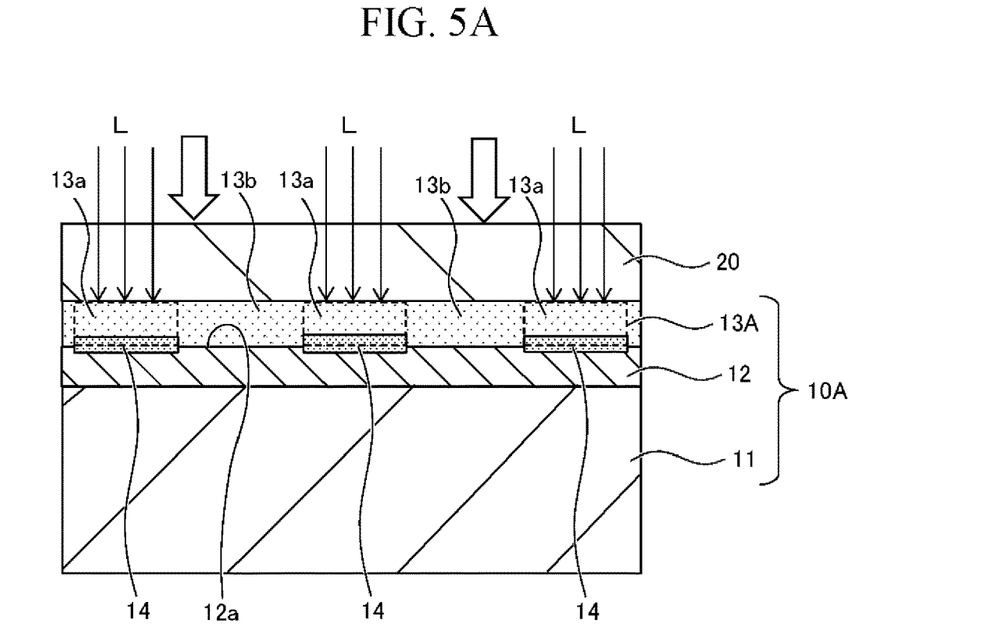
FIG. 5A is a schematic conceptual view for explaining a modification of the step of forming the diffusion layer of FIG. 2B.
Figure 5B:
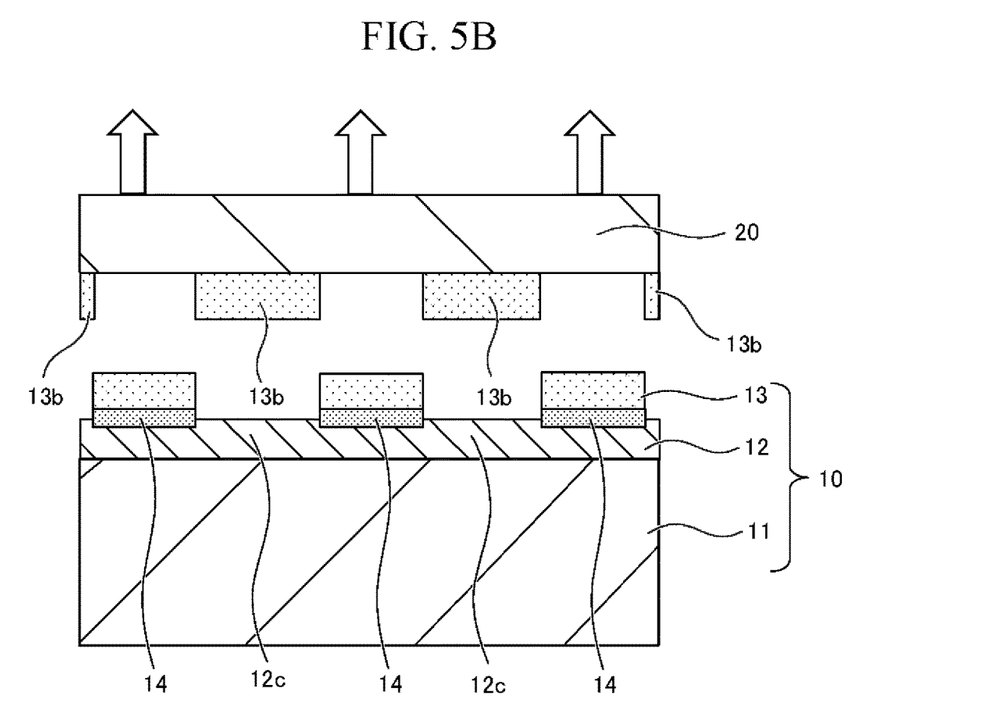
FIG. 5B is a schematic conceptual view for explaining a modification of the step of forming the seed layer of FIG. 2C.

With reference to FIG. 5A and FIG. 5B, modifications of the present embodiment will be described. FIG. 5A and FIG. 5B are schematic conceptual views for respectively explaining a modification of the formation step S2 of the diffusion layer 14 shown in FIG. 2B and a modification of the formation step S3 of the seed layer 13 shown in FIG. 2C.

The embodiment described above removes the removing portion 13b using an adhesive tape, but the removal is not limited thereto. The removing portion 13b may be removed using a permeable member 20 as in the modifications shown in FIG. 5A and FIG. 5B, for example.

In this case, as shown in FIG. 5A, in the formation step S2 of the diffusion layer 14, the permeable member 20 having permeability to the laser beam L is made to adhere to the surface of the coating layer 13A of the prepared substrate with coating-layer 10A. To this end, the permeable member 20 is pressed against the surface of the coating layer 13A by a pressing member (not shown) with a predetermined pressing force (specifically, 1 MPa or greater). With the permeable member 20 kept adhering to the coating layer 13A, the wiring portion 13a of the coating layer 13A is irradiated with the laser beam L via the permeable member 20. This forms the diffusion layer 14 between the underlayer 12 and the wiring portion 13a of the coating layer 13A.

Next, as shown in FIG. 5B, in the formation step S3 of the seed layer 13, the permeable member 20 is peeled off from the substrate with coating-layer 10A, together with the removing portion 13b of the coating layer 13A, thus removing the removing portion 13b of the coating layer 13A from the underlayer 12.

When the permeable member 20 is removed from the coating layer 13A, pressing by the pressing member is halted and the permeable member 20 is moved in a direction away from the surface of the coating layer 13A, so that the permeable member 20 is peeled off from the surface of the coating layer 13A.

Herein, as described above, since the diffusion layer 14 is formed between the underlayer 12 and the wiring portion 13a of the coating layer 13A, the adhesion between the removing portion 13b of the coating layer 13A and the underlayer 12 is weaker than that between the wiring portion 13a of the coating layer 13A and the underlayer 12. Therefore, the removing portion 13b of the coating layer 13A is easily peeled off from the underlayer 12.

After the irradiation of the laser beam, since the removing portion 13b of the coating layer 13A is attached to the surface of the permeable member 20 on its coating layer side, the removing portion 13b can be easily peeled off from the substrate with coating-layer 10A, together with the permeable member 20 without damaging the substrate 11. In this manner, the substrate with seed-layer 10 can be produced. Unlike an adhesive tape, the permeable member 20 is reusable and is thus useful.

The adhesion between the permeable member 20 and the coating layer 13A may be lower than that between the wiring portion 13a of the coating layer 13A and the underlayer 12 and higher than that between the removing portion 13b of the coating layer 13A and the underlayer 12.

The permeable member 20 may be transparent so as to be permeable to the laser beam L. Further, the permeable member 20 may have the heat resistance to the extent that it does not melt with the heat diffused from the coating layer 13A (specifically, around 500 to 600° C.).

Examples of the material of the permeable member 20 that satisfy these conditions include quartz glass or no alkali glass, for example. Since the permeable member 20 made of these materials adheres to the removing portion 13b made of the noble metal element such as Ag described above after the irradiation of the laser beam, the removing portion 13b can be peeled off together with the permeable member 20 without removing the wiring portion 13a (seed layer 13). Further, the surface of a permeable and heat-resistant material may be coated with a glass substance such as quartz glass or no alkali glass, as long as the permeable member 20 can be peeled off together with the removing portion 13b. It should be noted that the permeable member 20 may be adhesively attached to the coating layer 13A via an adhesive, as necessary.

EXAMPLES

Examples of the present disclosure will be described below.

A wiring board was produced using a substrate with coating-layer through the aforementioned methods for manufacturing in the present embodiment and the modifications. Then, the surface condition of the substrate with seed-layer after the seed layer is formed thereon was observed. The details will be described below.

Example 1

A test substrate with coating-layer corresponding to the substrate with coating-layer was prepared. The test substrate with coating-layer includes an underlayer (having a thickness of 100 nm) made of $WSi_2$ formed on the surface of an insulating substrate by sputtering, and a coating layer (having a thickness of 100 nm) made of Ag formed so as to coat the surface of the underlayer.

It should be noted that the coating layer is a layer formed such that ink in which Ag nanoparticles were dispersed in the dispersion medium (15 mass % concentration) was applied onto the surface of the underlayer by spin coating (at a rotation speed of 1,000 rpm for 30 seconds) and the applied ink was then dried (under the atmosphere at 120° C. for 30 minutes).

Through such drying, the amount of the dispersion medium of the ink remaining in the coating layer (hereinafter, referred to as the remaining amount of the dispersion medium) was reduced to 1.0 mass % or less relative to the coating layer. In other words, the amount of Ag forming the coating layer was 99.0 mass % or greater relative to the coating layer.

It should be noted that the remaining amount of the dispersion medium corresponds to the amount of the dispersion medium of the ink remaining in the coating layer relative to the coating layer (the total mass of the Ag nanoparticles forming the coating layer and the dispersion medium of the ink remaining in the coating layer). The remaining amount of the dispersion medium was measured using the GC-MS (gas chromatography).

Next, the wiring portion of the coating layer corresponding to a predetermined wiring pattern of the wiring layer was irradiated with a laser beam having a wavelength of the near infrared region so that a diffusion layer in which the element forming the underlayer and the element forming the coating layer were mutually diffused was formed between the underlayer and the wiring portion of the coating layer. The conditions of the laser beam irradiation vary depending on the width of the predetermined pattern, the thickness of the coating layer, and the absorption rate of the laser beam by the ink, and thus were adjusted as appropriate. For example, for the width of the predetermined pattern (wiring pattern) of 1.6 mm, the irradiation was performed under the conditions of 180 W and 10 mm/min.

Next, the seed layer was formed such that the portion excluding the wiring portion of the coating layer which was irradiated with the laser beam (in other words, the portion of the coating layer that was not irradiated with the laser beam) was removed, as a removing portion, from the underlayer using a scotch tape as the adhesive tape. Specifically, the scotch tape was applied onto the surface of the coating layer and peeled off from the surface of the coating layer, and the removing portion was peeled off from the underlayer, together with the scotch tape. In this manner, a test substrate with seed-layer including the seed layer excluding the diffusion layer of the wiring portion of the coating layer was prepared. The surface condition of this test substrate with seed-layer was observed using a microscope.

Next, the film-deposition apparatus shown in FIGS. 3 and 4 was used to form a metal layer (having a thickness of 20 μm) made of Cu on the surface of the test substrate with seed-layer. Specifically, the formation was conducted using a 1.0 mol/L copper sulfate aqueous solution as the metallic solution, an oxygen-free copper wire as the anode, and Nafion (registered trademark) (having a thickness of about 8 μm) as the solid electrolyte membrane, such that the solid electrolyte membrane was pressed against at least the seed layer by a pump with a pressure of 1.0 MPa and a voltage of 0.6 V applied for a predetermined film deposition time.

Next, the solid electrolyte membrane was peeled off from the seed layer, and the substrate with seed-layer on which the metal layer was formed was removed from the film-deposition apparatus. Then, an exposed portion without the seed layer of the underlayer was removed by plasma etching using a $CF_4/O_2$ mixed gas. In this manner, a wiring board having a wiring layer formed on the surface of the substrate was manufactured.

Example 2

A wiring board was manufactured using a test substrate with coating-layer in the same manner as in the manufacturing of Example 1. Then, the surface condition of the test substrate with seed-layer was observed. It should be noted that Example 2 was different from Example 1 in that Example 2 used quartz glass to remove the removing portion.

Specifically, the quartz glass as a permeable member was made to adhere to the surface of the coating layer of the prepared test substrate with coating-layer. For such adhesion, the quartz glass was pressed against the surface of the coating layer with a load of 1 MPa by a pressing member. With the quartz glass kept adhering to the coating layer, the wiring portion of the coating layer was irradiated with a laser beam via the quartz glass, so that the diffusion layer was formed. Next, the pressing by the pressing member was halted, and the removing portion of the coating layer was removed from the underlayer such that the permeable member was peeled off from the test substrate with coating-layer, together with the removing portion of the coating layer. In this manner, a test substrate with seed-layer including the seed layer excluding the diffusion layer of the wiring portion of the coating layer was prepared.

[Results and Study]

Figure 6A:
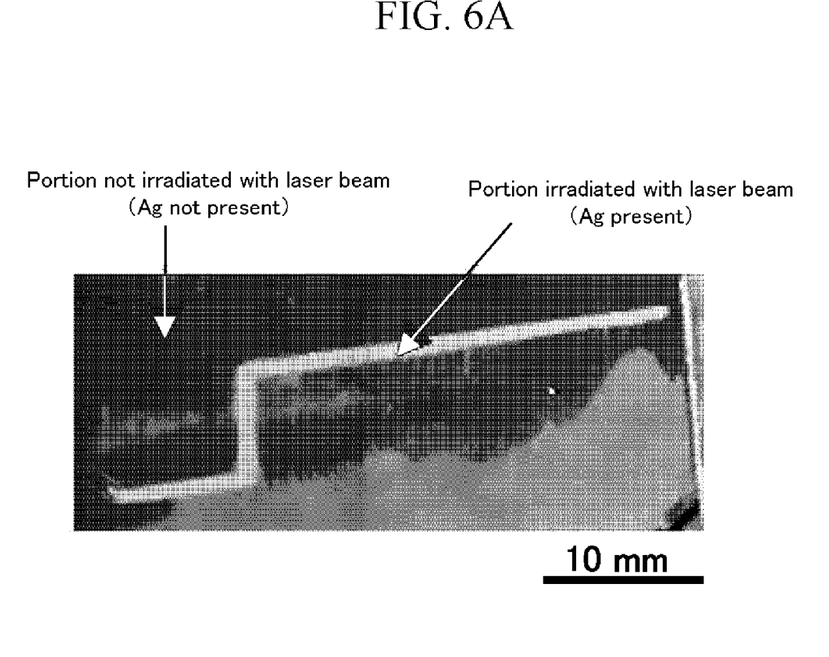
FIG. 6A is an image in a plan view of a test substrate with seed-layer of Example 1 observed by a microscope.
Figure 6B:
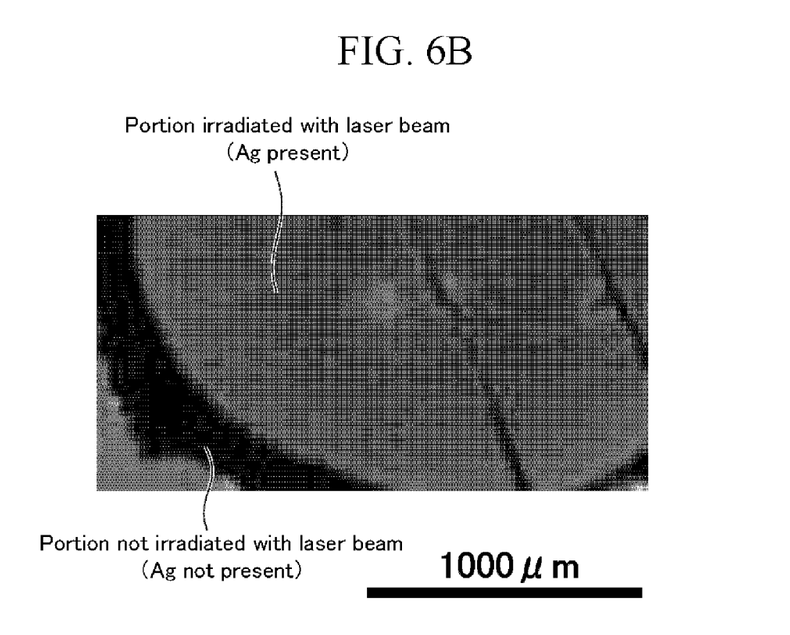
FIG. 6B is an image in a plan view of a test substrate with seed-layer of Example 2 observed by a microscope.

The observation results of the surface conditions of the test substrates with seed-layer of Example 1 and Example 2 are shown in FIG. 6A and FIG. 6B, respectively. FIG. 6A and FIG. 6B are images in a plan view of the test substrates with seed-layer of Example 1 and Example 2 that were observed by a microscope.

As shown in FIG. 6A and FIG. 6B, the seed layer made of Ag is confirmed to have been formed in the portion that was irradiated with the laser beam. Meanwhile, no formation of the seed layer made of Ag was confirmed and the underlayer was exposed in the portion that was not irradiated with the laser beam. In other words, the wiring portion of the coating layer that was irradiated with the laser beam was not peeled off from the underlayer, while the removing portion of the coating layer that was not irradiated with the laser beam was peeled off from the underlayer.

These results prove that with the diffusion layer formed between the underlayer and the wiring portion of the coating layer, the wiring portion of the coating layer more firmly bonded to the underlayer as compared to the removing portion of the coating layer.

Further, the seed layer formed of the portion excluding the diffusion layer of the wiring portion of the coating layer bonded to the underlayer via the formed diffusion layer. This improves the adhesion between the underlayer and the seed layer, so that in peeling off the solid electrolyte membrane after the metal layer is formed, the underlayer and the seed layer were prevented from being peeled off from each other.

Although the embodiment of the present disclosure has been described in detail above, the present disclosure is not limited to the above embodiment, and any design changes can be made without departing the spirit of the present disclosure described in the claims.

What is claimed is:

1. A method for manufacturing a wiring board, the wiring board including an insulating substrate and a wiring layer disposed on a surface of the insulating substrate, and the wiring board having a predetermined wiring pattern, the method comprising:

providing:
  an insulating substrate,
  an underlayer, which is electrically-conductive, disposed on a surface of the insulating substrate, wherein the underlayer includes an oxide film formed on a surface thereof, the providing the underlayer comprising vapor deposition of the oxide film, and
  a coating layer, which is electrically-conductive, disposed so as to coat the oxide film;

forming a diffusion layer, in which an element forming the underlayer and an element forming the coating layer are mutually diffused, between the underlayer and a first portion of the coating layer, the forming the diffusion layer comprising irradiating the first portion of the coating layer corresponding to the predetermined wiring pattern with a laser beam;

forming a seed layer from the first portion of the coating layer by removing a second portion of the coating layer, thereby leaving the first portion of the coating layer, disposed on the diffusion layer, as the seed layer;

forming a metal layer on a surface of the seed layer by disposing a solid electrolyte membrane between an anode and the seed layer as a cathode, pressing the solid electrolyte membrane against at least the seed layer, and applying a voltage between the anode and the underlayer, to thereby reduce metal ions contained in the solid electrolyte membrane; and forming the wiring layer by removing, from the insulating substrate, a portion of the underlayer not covered by the seed layer.

2. The method for manufacturing the wiring board according to claim 1, wherein
the forming the diffusion layer further comprises, causing a permeable member, permeable to the laser beam, to adhere to a surface of the coating layer, and irradiating the first portion of the coating layer with the laser beam via the permeable member, thereby forming the diffusion layer, and
the forming the seed layer further comprises, removing the second portion of the coating layer such that the permeable member is removed together with the second portion of the coating layer.

3. The method for manufacturing the wiring board according to claim 1, wherein
an element forming the coating layer is a noble metal element, and
the irradiating the first portion of the coating layer with the laser beam comprises diffusing oxygen, originating from the oxide film, into the diffusion layer.

4. The method for manufacturing the wiring board according to claim 1, wherein the coating layer contains metallic nanoparticles.

* * * * *